United States Patent [19]

Shaffer

[11] 4,251,869
[45] Feb. 17, 1981

[54] FREQUENCY-TO-BINARY CONVERTER

[75] Inventor: Robert G. Shaffer, New Britain, Pa.

[73] Assignee: Fischer & Porter Company, Warminster, Pa.

[21] Appl. No.: 38,422

[22] Filed: May 14, 1979

[51] Int. Cl.³ .................. G01R 23/02; G06F 15/20
[52] U.S. Cl. .................. 364/484; 324/78 R
[58] Field of Search ......... 364/484; 324/78 R, 78 D; 328/129; 235/92 FQ

[56] References Cited

U.S. PATENT DOCUMENTS

| | | | |
|---|---|---|---|
| 3,720,871 | 3/1973 | Brown | 364/484 X |
| 3,829,785 | 8/1974 | Schroder et al. | 364/484 X |
| 4,107,600 | 8/1978 | McMannis | 364/484 X |
| 4,137,497 | 1/1979 | Lowenschuss | 364/484 X |

OTHER PUBLICATIONS

Analog-to-Digital Frequency Measuring System; IBM Technical Disclosure Bulletin, vol. 8, No. 10, Mar. 1966, pp. 1361–1366; A. P. Yeager.

*Primary Examiner*—Edward J. Wise
*Attorney, Agent, or Firm*—Michael Ebert

[57] ABSTRACT

A converter capable of accurately and rapidly converting an input signal whose frequency varies as a function of a parameter being metered into a bit parallel number for manipulation by a digital computer. The incoming signal, before being applied to the converter, is shaped to produce a continuous train of square wave periods, each beginning with a leading edge. A measurement is made during a time interval which need not be synchronized with the input signal and is independent of its frequency, the interval having a fixed duration which is a predetermined multiple of a given unit of time. In this interval, the following factors are measured in the slice of the square wave train falling between the start and finish points of the interval: the number of time units occurring between the start point and the leading edge of the first complete wave period in the slice; the number of complete wave periods lying within the slice, and the number of time units occurring between the last leading edge appearing in the slice and the finish point. The measured factors are applied to the digital computer which determines the frequency of the incoming signal in binary terms from the equation relating frequency to these factors.

5 Claims, 6 Drawing Figures

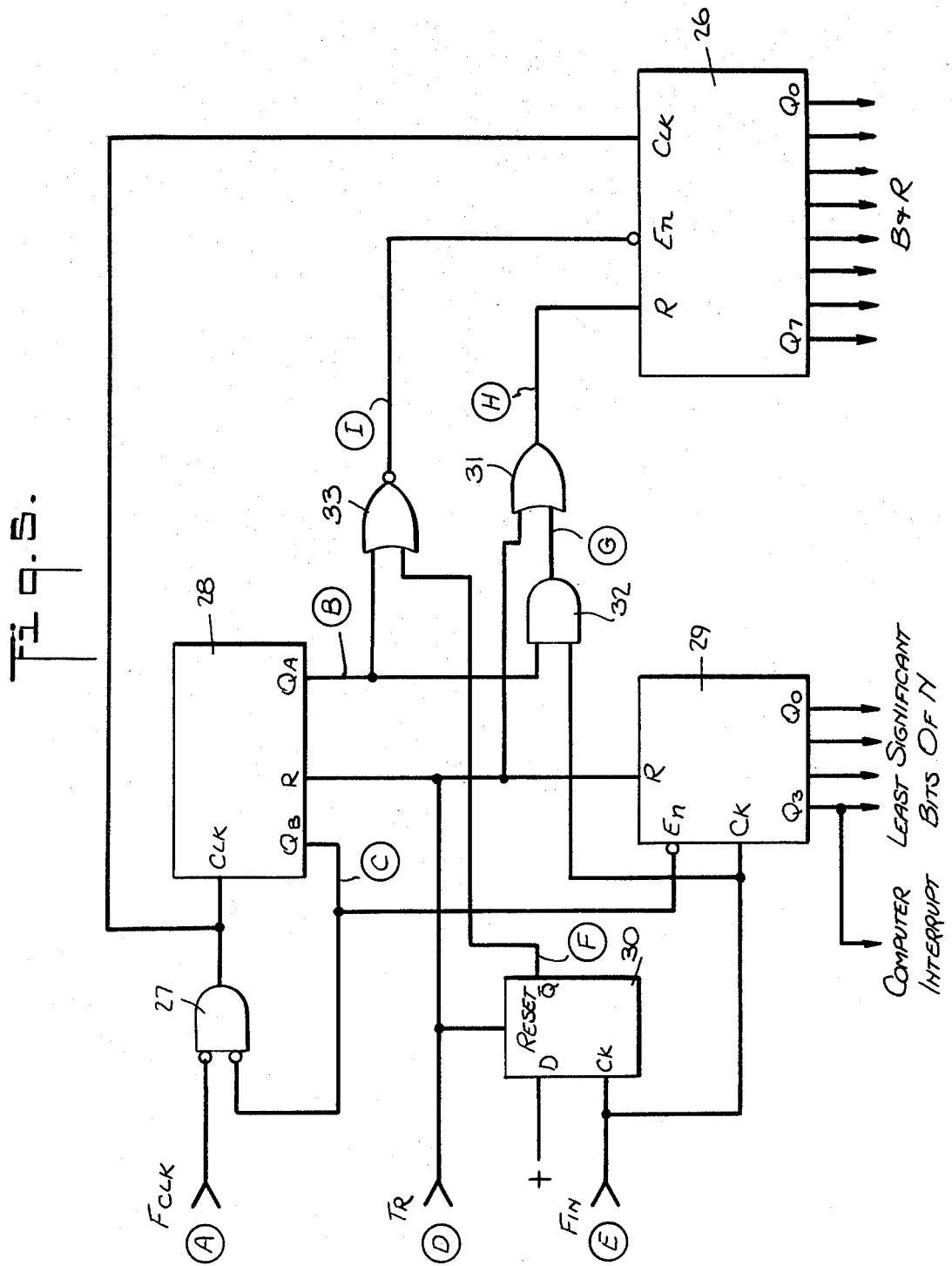

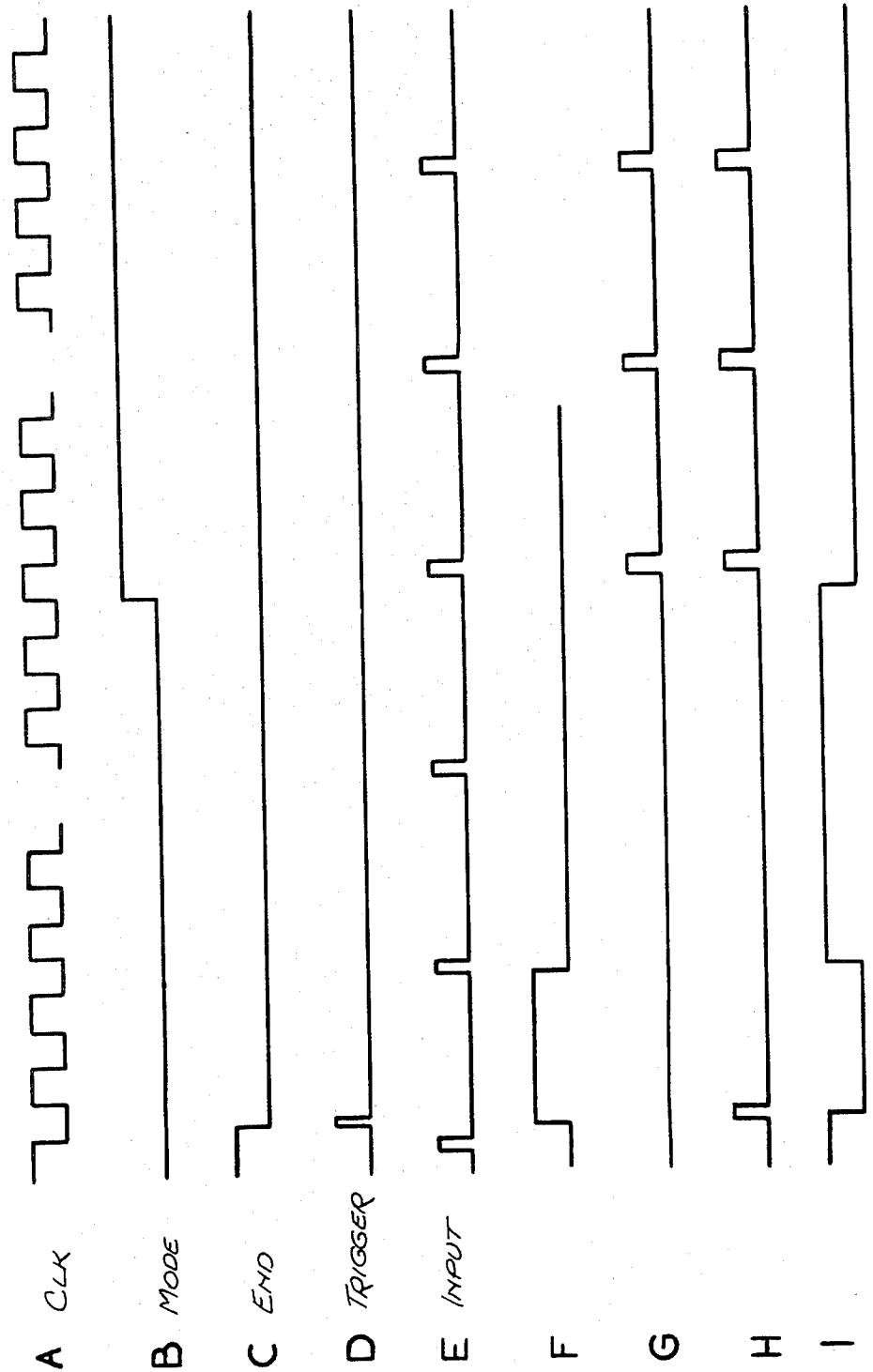
Fig. 9.B.

FREQUENCY-TO-BINARY CONVERTER

BACKGROUND OF INVENTION

Field of the Invention

This invention relates generally to frequency-to-binary converters, and more particularly to a converter adapted to convert accurately and at high speed an input signal whose frequency varies as a function of a parameter being measured into a bit parallel number for manipulation in a digital computer.

In a typical process control loop, a fluid is conducted through a control valve or final control element into a process load. An automatic electronic controller is a component in a process control loop which is subject to disturbances, the controller acting to maintain a process variable, such as flow rate, temperature, pressure, humidity or liquid level, at a desired value. To accomplish this purpose, the controller receives both the desired value or set point and the process variable and compares these values to produce an output signal that depends on the error therebetween, which output signal serves to govern the final control element to correct this error. Automatic controllers are generally classified by the type of control action or modes of control they perform, such as the proportional position mode, proportional plus reset and proportional plus rate.

In place of individual process control loops, one for each parameter being sensed and controlled, it is now the practice in many large chemical processing and other industrial plants to make use of a direct digital control system (DDC) which employs a digital computer on a time-sharing or multiplexing basis to carry out the functions that previously had been performed by individual electronic controllers, one for each loop.

Since in the typical process control loop the parameter being measured by the primary transducer is represented by an analog signal and the final control element is operated by an analog signal obtained from the electronic controller, in a DDC system associated with a group of primary transducers and a related group of final control elements, it is necessary to convert the analog signals from the primary transducers into corresponding digital values for manipulation by the digital computer and to convert the digital output of the computer into analog signals for operating the final control elements.

When, for example, the process variable is a changing temperature which the primary transducer represents as a voltage or current signal of corresponding magnitude or intensity, this input signal must be converted into a digital value in a DDC system. In this way, the digital computer in the system, which is adapted to execute a program carried in its memory, is then able to manipulate the digital value to produce an output for carrying out the desired control function. When, however, the process variables being sensed by the primary transducers are represented by signals whose frequencies vary as a function of the parameters being measured, then the DDC system must include a frequency-to-binary converter.

Thus a vortex-shedding or Swirlmeter type of flowmeter for measuring the rate of fluid flow through a flow tube produces an output signal whose frequency depends on flow rate. Such flowmeters are disclosed in the Herzl U.S. Pat. No. 3,854,334 and in the patents referred to therein. Similarly, turbine meters yield an output signal that is proportional to flow rate.

When the input signals applied to a DDC system are derived from a group of primary transducers yielding signals of varying frequency, these signals must be applied to a multiplexer which acts to scan the signals in sequence and to feed each signal sample into a frequency-to-binary converter which converts each sample into a bit parallel binary number that is read by the digital computer.

The digital output of the computer in the DDC system in response to each incoming signal sample is converted into an analog signal sample for operating the final control element in the process control loop which includes the primary transducer producing the incoming signal in question. In the output of the system, the analog signal samples which appear in sequence in the course of a multiplexer scan cycle must be held at their existing values until the next scan cycle, so that the final control elements are maintained in accordance with the existing values until new values are yielded by the computer. This holding action also applies to the digital readouts of the computer.

The ability of a DDC system to handle a very large number of process control loops on a multiplexing basis depends mainly on the speed and accuracy of the frequency-to-binary converter. If this conversion can be carried out accurately at high speed, then many incoming frequencies can be scanned and processed in the course of a brief scanning cycle. Since the respective analog and digital outputs of the computer are maintained constant between scanning cycles, this effectively results, for all intents and purposes, in simultaneous real time outputs.

To give a rough example of the relationship between the time it takes to effect frequency-to-binary conversion and the ability of a DDC system to handle a large number of input frequencies, let us assume that there are 100 input frequencies to be scanned in each multiplexing cycle, and each conversion takes one tenth of a second. In this case, it would take 10 seconds to complete a scan, and there would be, with respect to each analog output sample, a full 10 second pause between successive samples. This would certainly not begin to approach a real time output. On the other hand, if it only took a thousandth of a second to complete a frequency-to-binary conversion, then there would only be a 1/10th second pause between successive samples, and this would approach real time conditions.

In order, therefore, to render practical a DDC system for handling input signals from the primary transducers which are of the variable frequency type, it is essential that the frequency-to-binary conversion be fast and accurate.

Two widely used methods are known to accomplish frequency-to-binary conversion. The first known technique is based on the frequency counter approach and simply acts to count the number of cycles that occur in a predetermined time period, the count thereby providing a number representing frequency. The main drawback to this technique is that to obtain high resolution, a large number of cycles must be counted. Thus to resolve one part in 1,000, one must count 1,000 cycles. If the signal frequencies are in a high frequency range, the drawback is not serious; but for low frequencies, the counting time period is necessarily quite long.

The second known technique is much faster, for it effects frequency-to-binary conversion by measuring the time required for completing a single cycle of the frequency being converted. But this presents a serious problem when high frequencies are involved, for then very small increments of time must be resolved. For example, if the incoming frequency is 1000 Hz, the period to be measured is 0.001 seconds. To measure 0.001 seconds with a resolution of 0.1% requires resolving one microsecond.

Both known conversion methods suffer from the disadvantage that the time to complete the measurement varies with the incoming frequency, so that high frequencies can be measured quickly, whereas lower frequencies take proportionately longer times. This can be a serious drawback when the time available to carry out the measurement is limited and cycle-to-cycle jitter of the incoming frequency dictates period averaging.

The following prior patents are of interest in connection with frequency-to-binary conversion: U.S. Pat. No. 3,928,797 to Kiencke; U.S. Pat. No. 3,929,798 to Valis; U.S. Pat. No. 3,829,785 to Schroder et al.; U.S. Pat. No. 3,997,764 to Belmonte et al. and U.S. Pat. No. 3,609,756 to Hallsall. The Schroder patent is of particular interest, for it discloses a converter in which the frequency and period of a signal is measured during a measuring time interval with the aid of a chain of counting circuits and an arithmetic unit connected to the outputs thereof.

SUMMARY OF INVENTION

In view of the foregoing, the main object of this invention is to provide a frequency-to-binary converter operable in conjunction with a digital computer to rapidly and precisely convert an incoming signal of unknown frequency into a bit parallel binary number for manipulation by the computer.

More particularly, it is an object of this invention to provide a converter of the above type which carries out measurements on a signal of unknown frequency during a fixed time interval in a manner whereby the time to make the measurements does not depend on the frequency of the signal being converted.

Also an object of the invention is to provide a converter of relatively simple and inexpensive design which functions efficiently and reliably.

Briefly stated, in a converter in accordance with the invention, the incoming signal, before being applied thereto, is first shaped to produce a continuous train of square wave periods each beginning with a leading edge. The converter carries out measurements during a time interval which need not be synchronized with the incoming signal and is independent of its frequency, this interval having a fixed duration which is a predetermined integral multiple of a given unit of time.

In this time interval, the following factors are measured in the slice of the continuous train falling between the start and finish points of the interval:

I. The number of time units occurring between the start point of the interval and the leading edge of the first complete wave period in the slice.

II. The number of complete wave periods lying within the slice.

III. The number of time units occurring between the last leading edge appearing in the slice and the finish point.

These factors are routed into the digital computer which determines the binary number from the equation relating frequency to the measured factors.

OUTLINE OF DRAWINGS

For a better understanding of the invention as well as other objects and further features thereof, reference is made to the following detailed description to be read in conjunction with the accompanying drawings, wherein:

FIG. 5 is a block diagram of another preferred embodiment of the converter; and

FIG. 6 is composed of waveforms illustrating the activity at various points in the second converter.

DESCRIPTION OF INVENTION

Figure 1:
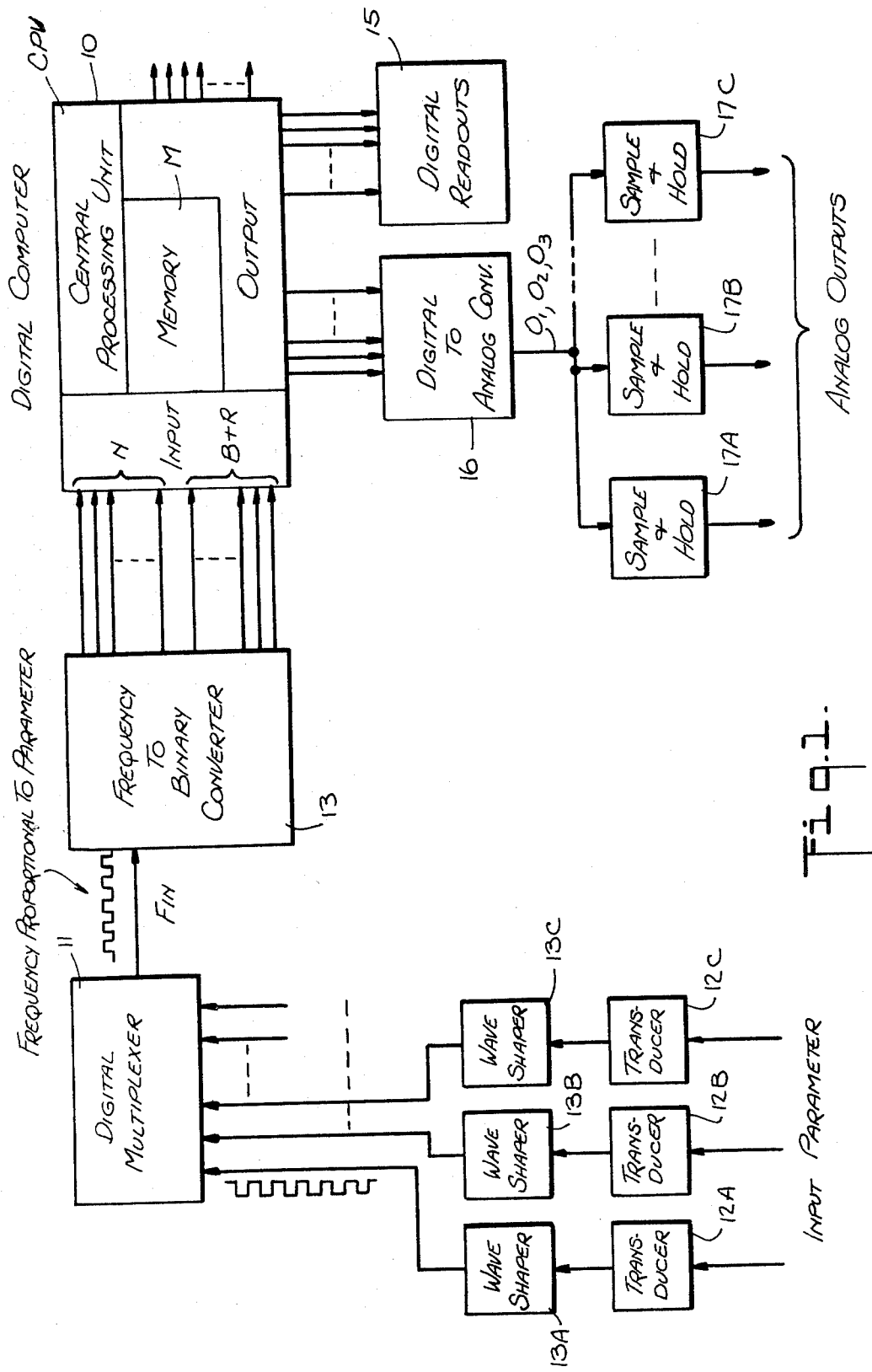
FIG. 1 is a block diagram of a direct digital control system which includes a frequency-to-binary converter in accordance with the invention.

The DDC System:

Referring now to FIG. 1, there is shown a DDC system in which a digital computer 10 of standard design governs the operation of a digital multiplexer 11 that sequentially selects the incoming frequencies derived from a group of primary transducers 12A, 12B, etc., and routes it to a frequency-to-binary converter 13 in accordance with the invention.

Primary transducers 12A, 12B, 12C etc., each sense a parameter of interest, such as flow rate, temperature, pressure and other process variables, to produce an incoming signal whose frequency is proportional to the sensed process variable. In order to attain high conversion accuracy, the transducer signal, before being applied to multiplexer 11, is shaped by wave shaper 14A, 14B, 14C etc., into a continuous train $F_{in}$ of square wave periods whose repetition rate is equal to the frequency of the signal, each period beginning with a leading edge.

Digital multiplexer 11 acts as an electronic commutator which in the course of each scanning cycle sequentially applies the shaped signals $F_{in}$ derived from each of the primary transducers 12A, 12B, 12C, etc. into converter 13 which converts each signal applied thereto into a bit parallel binary number which is read by computer 10.

Computer 10 includes a central processing unit CPU which may be in microprocessor form and a memory M which stores a program serving to manipulate each of the binary numbers representing the parameters and to manipulate these values to produce in the same sequence in which the parameters are scanned, digital outputs which are indicated by digital readouts 15.

A digital computer is a machine capable of carrying out arithmetic or logic operations on digital data entered into its input and of yielding at its output numerical results or decisions. All digital computers, whether in large-scale general-purpose form or in micro-computer form, are essentially composed of a central processing unit, a memory system and input-output devices.

The task assigned to a central processing unit (CPU) is to receive and to store for later processing, data in the form of binary digits or bits (0's or 1's), to perform arithmetic or logic operations on this data in accordance with previously-stored instructions, and to deliver the results to the user of the computer through a read-out device such as an electric typewriter or a cathode ray display tube. Thus a digital computer may be used in conjunction with industrial process control loops to compare the process variable in each loop with a set point and to provide an output signal which depends on the deviation of the variable from the set point. The output signal is used to govern a final control element such as a valve or pump in the process loop to cause the variable to change in a direction and to an extent bringing the variable in line with the set point.

The number of digits or bits needed to represent a computer instruction or the number of bits needed to represent the largest data element normally processed by the computer is referred to as a "word." The number of bits that a computer is capable of processing as a unit is known as a "byte." A byte may be equal to or less than the number of bits in a word; hence both an 8-bit or a 16-bit word-length computer is capable of processing data in 8-bit bytes.

The central processing unit is that component of the computer which controls the interpretation and execution of instructions. In general, a CPU contains the following elements: "Control" which includes logic and instructions for decoding and executing the program stored in "memory"; "Registers" which provide control with temporary storage in the form of random-access memories (RAM's) and their associated functions; an Arithmetic and Logic Unit (ALU) that performs arithmetic and logic operations under supervision of control.

The memory system is that component of a computer which holds data and instructions, each instruction or datum being assigned a unique address that is used by the CPU when fetching or storing the information. There are three distinct types of memories, each of which in a mini-computer can be reduced to a single silicon chip. The read-only-memory or ROM is a memory adapted to store information permanently, such as a math function or a micro-program (a special purpose program initiated by a single instruction in the system's main program). A memory that can be programmed by the user, but only once, is known as a programmable ROM or PROM; hence when a PROM is programmed, it then functions as a ROM.

The basic "hardware" components of a digital computer are the central processing unit (CPU), the memory system and the input-output (I/O) device. The registers, the control and the arithmetic logic unit of the CPU is linked with the memory system and the I/O device by a data bus; that is, a group of wires that allows the memory, the CPU and the I/O to exchange "words."

The "software" associated with a computer are those expedients by which the computer is explicitly told what to do through a step-by-step sequence of individual instructions which together constitute a program to perform some specific function to yield a solution to a specific problem. An "instruction" is a group of bits that define a particular computer operation. Thus an arrangement may direct a computer to move data, to carry out arithmetic and logic operations, to control I/O devices, or to make a decision as to which instruction is to be executed next.

For process control purposes, the digital outputs of computer 10 are applied to a digital-to-analog converter 16 whose analog output $O_1$, $O_2$, etc., can be any function of the system input, subject to the computational limits of the computer. These outputs are held in respective sample and hold circuits 17A, 17B, 17C, etc. which in a DDC system for process control purposes typically yield outputs in a 4-to-20 mAdc range to govern the final control elements in the process control loops which include the primary tranducers. The computer functions as the controller for the several loops and offers a wide flexibility in manipulating the inputs. It is capable of scaling, linearizing, compensating and totalizing the inputs and of operating in any desired control mode.

The invention does not reside in the DDC system, for this may be in any known form, but in frequency-to-binary converter 13 included in the system, for it is this converter which makes it possible for the DDC system to function effectively with input signals whose frequencies are proportional to the input parameters.

Figure 2:
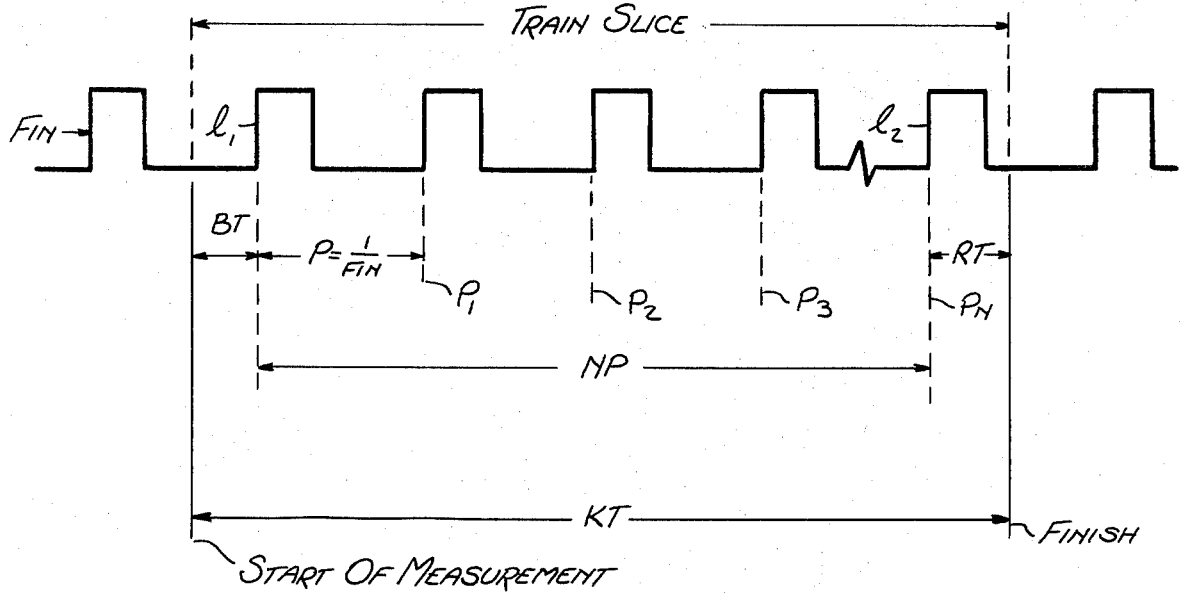
FIG. 2 is a waveform explanatory of the principles underlying the invention.

The Frequency-to-Binary Conversion Technique:

Referring now to FIG. 2, there is shown a continuous train $F_{in}$ of square wave periods P derived from one of the primary transducers, each period having a positive leading edge. The frequency or repetition rate of this wave train is unknown; and to determine its frequency, measurements are made during a time interval KT in which the value K is a positive integer and the value T is a predetermined unit of time. Thus when K is selected to be 1020, and the unit T is 100 microseconds, the interval KT is then 102 milliseconds.

In FIG. 2, the measurement interval KT has a start point S and a finish point F. Thus it takes a succession of 1020 units T of 100 microseconds each to go from start point S to finish point F in the example cited. This measurement interval need not be synchronized with input signal $F_{in}$ and is independent of its frequency, the same interval being used for all input signals $F_{in}$, regardless of their frequencies.

The period P of each square wave period in the continuous train thereof is equal to $1/F_{in}$. The measurement interval KT is taken during a slice of the continuous train $F_{in}$, within which, depending on the position of the start and finish points S and F, there are a certain number of complete wave periods P. Thus in the example illustrated, the complete wave periods P are represented by $P_1$, $P_2$, $P_3$ ... $P_N$.

The measurement procedure is as follows:

I. First, the number of time units T which occur between start point S and the first leading edge $l_1$ appearing in the wavetrain slice is counted. The number of this count is designated B. Hence in FIG. 2, the distance between start point S and the first leading edge $l_1$ is represented by BT.

II. Then the number of complete wave periods ($P_1$ to $P_N$) which occur during measurement interval KT is counted to yield the number N thereof.

III. Finally, the number of time units T which occur between the last leading edge $l_2$ to appear in the train slice and the finish point F is counted to provide the number R. Hence in FIG. 2, the distance between the last leading edge $l_2$ and finish point F is represented by RT.

From the foregoing, it will be evident that the duration of the measurement interval KT is equal to $BT+NP+RT$. Thus:

$$\frac{1}{F_{in}} = P = \frac{K-(B+R)}{N}T \qquad \text{Equation One}$$

or $$F_{in} = \frac{1}{T}\frac{N}{K-(B+R)}$$

By knowing the fixed values of K and T and determining the values of factors N and B+R, one can effect the desired conversion. These values are routed into the computer which includes hardware capable of carrying out the calculation of equation one to produce the required binary value representing the parameter of interest.

Figure 4:
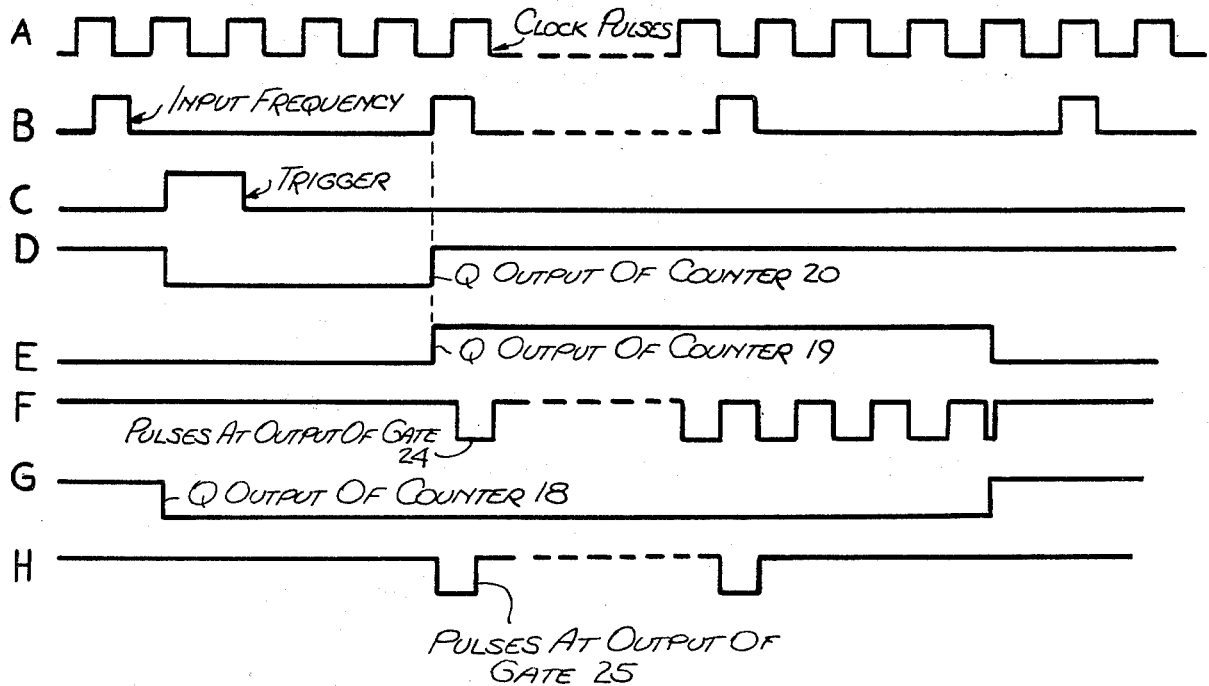
FIG. 4 is composed of waveforms illustrating the activity at various points in the first converter.
Figure 3:
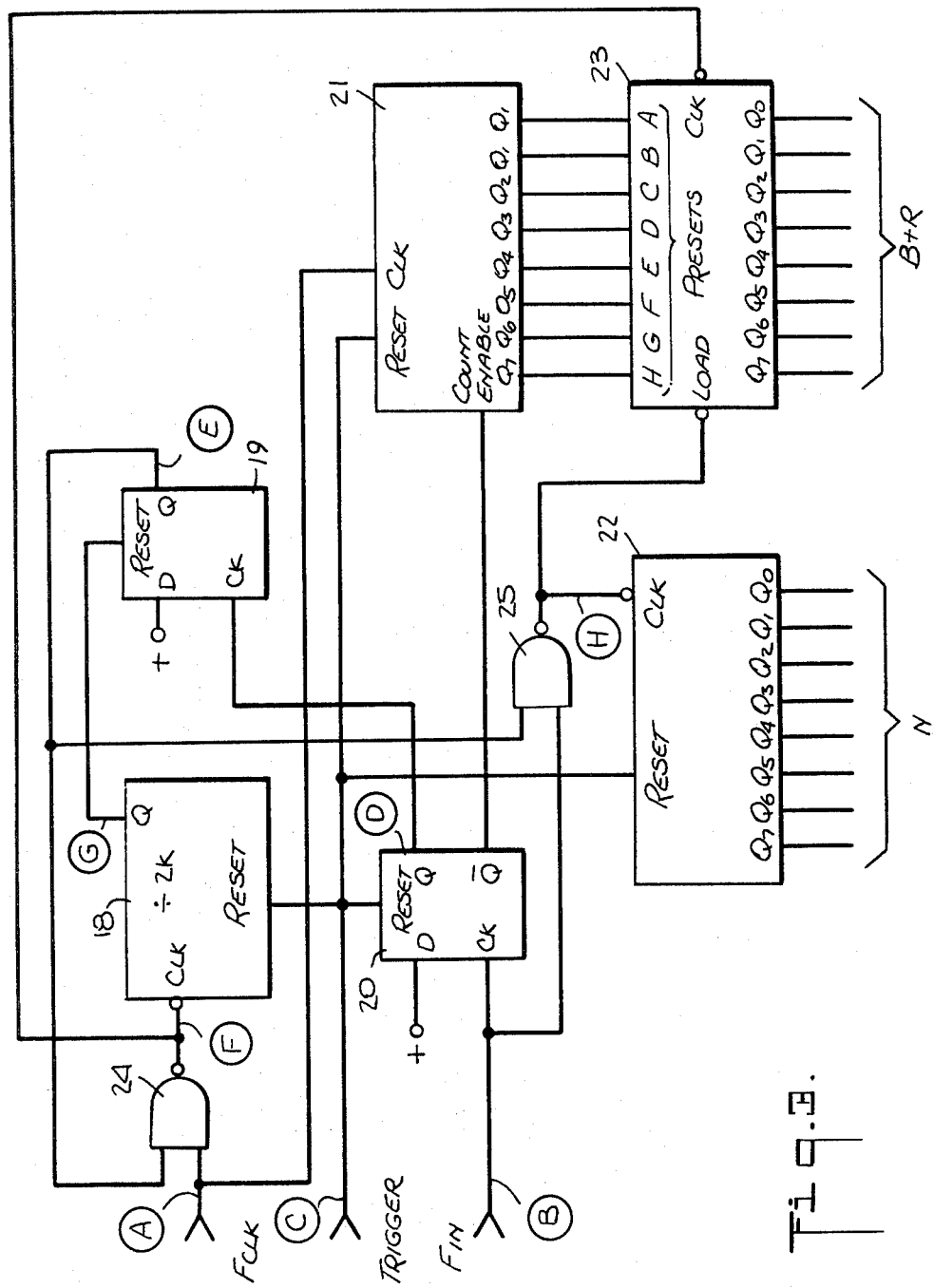
FIG. 3 is a block diagram of one preferred embodiment of the converter.

Converter Circuit:

Referring now to FIG. 3, there is illustrated a preferred embodiment of a frequency-to-binary converter in accordance with the invention, the circuit having three input terminals $F_{clk}$, $T_r$ and $F_{in}$. Applied to input terminals $F_{clk}$ are accurate clock pulses whose frequency is equal to 1/T, these pulses being shown by form A in the FIG. 4 timing diagram. Applied to input terminal $T_r$ is a trigger pulse which, as shown by form C in FIG. 4, is a positive pulse which signals the start of the conversion, conversion beginning on the high-to-low transition of the trigger.

Applied to input terminal $F_{in}$ is the continuous train of square wave periods of the unknown frequency that is to be measured. For best accuracy, these square wave periods, as shown in waveform B in FIG. 4, are shaped into narrow positive pulses of a duration equal in time to time unit T or less. The outputs N and B+R are available (K+1)T seconds subsequent to the falling edge of the trigger.

The converter circuit includes counters 18, 19, 20, 21, 22 and 23 as well as two AND gates 24 and 25. The N output of the converter is yielded by terminals $Q_0$ to $Q_7$ of counter 22 and the B+T output by terminals $Q_0$ to $Q_7$ of counter 23. Input terminal $F_{clk}$ is connected to one input of gate 24, the other gate input being connected to the Q output of counter 19. The output of gate 24 is connected to the clk input of counter 18 and to the clk input of counter 23.

The input terminal $T_r$ is connected to the RESET terminals of counters 18, 20, 21 and 22, the Q output of counter 18 being connected to the RESET terminal of counter 19. The input terminal $F_{in}$ is connected to the ck terminal of counter 20 whose Q terminal is connected to the ck terminal of counter 19 and whose $\overline{Q}$ terminal is connected to the COUNT-ENABLE terminal of counter 21. The input terminal $F_{in}$ is also connected to the Q terminal of counter 19. The output of gate 25 is connected to the clk terminal of counter 22 and to the LOAD terminal of counter 23. The $Q_0$ to $Q_7$ output terminals of counter 21 are connected to the A to H preset terminals, respectively, of counter 23.

The cycle begins on the low-to-high transition of trigger $T_r$. The trigger being high, this condition resets counters 18, 20, 21 and 22. When the trigger returns to low, counter 21 proceeds to count positive edges of the $F_{clk}$ pulses. When the first positive edge of $F_{in}$ occurs, counter 20 is set, thereby inhibiting further counting by counter 21, which sets counter 19 and causes it to go high at Q (point E). This allows pulses of $F_{clk}$ to pass through gate 24 to counter 19. It also allows pulses of $F_{clk}$ to pass through gate 25 to counters 22 and 23.

Each pulse at the output (point H) of gate 25 advances counter 22 one count and loads the count in counter 21 into counter 23. Between pulses at point H, counter 23 acts to count inverted $F_{in}$ pulses appearing at point F at the output of gate 25, beginning, of course, at the value that was loaded by the previous load pulse. This continues until counter 18 has counted K $F_{clk}$ pulses and point G and the Q output of counter 18 goes high, thereby resetting counter 19 connected thereto and inhibiting AND gates 24 and 25 connected to the Q output (point E) of counter 19.

No further counting can then occur, the N output being available at counter 22 and the B+R output being available at counter 23. The system is quiescent until the next trigger pulse appears at input terminal $T_r$ when the entire operating cycle is repeated.

The values N and B+R along with the values of K and T are then routed into any general purpose digital hardware wherein the calculation of equation ONE is carried out to determine the input frequency. The binary value of this frequency is then digitally manipulated in the computer to yield the desired system output.

We shall now give an example of this operation, assuming the following values:

$K=512$
$T=0.8$ ms; i.e., $F_{clk}=1250 H_3$
In this instance, $$F_{in} = 1250 \frac{N}{512 - (B+R)}$$

Value N must obviously be at least one and may be as large as 255 (assuming that counter 22 is an 8 bit counter). (B+R) may be from 0 to 225.

The maximum $F_{in}$ that can be measured is when $N=255$ and $(B+R)=O_3$—i.e., 622 $H_z$. The minimum $F_{in}$ that can be measured is when the period $1/F_{in}$ is equal to $B_{max} \times T$.

$$F_{min} = \frac{1}{(255 \times .0008)} = 4.9 \text{ Hz.}$$

Frequencies within this range are measured with a resolution of at least 9 bits (0.2%). The conversion takes place in a constant 410 ms measurement interval. To set up the circuit to measure other frequency ranges, the values of $F_{clk}$ and K can be changed as well as the length of counters 21, 22 and 23.

Since the maximum measurable frequency depends only on the number of counting stages available in counter 22 for producing N, the measurement of high frequencies requires many counting stages, and consequently many lines to transfer this number to the digital computer.

The effective length of the N counter 22 can be extended by detecting the point at which the N counter overflows, this event being used to interrupt the digital computer. The computer then keeps track of the number of times it was interrupted during the measuring interval. Assuming that the number of interruptions is Y, the effective N is then:

$$N_{effective} = (2^k \times Y) + N;$$

where k is the number of counter stages in the N counter. Since the maximum value of Y depends only on the computer software and memory, in practice, it can be very large and readily changed.

Second Embodiment:

The converter arrangement shown in FIG. 5 represents both a decrease in complexity and an increase in capability over those previously disclosed. In this arrangement, a counter 26 first measures value B, then passes this value to the computer where it is stored. The same counter is reset and then proceeds to measure value R. At the end of this measurement interval, the computer then reads N and R. The computer, which now holds the values N, R and B can then act to calculate the unknown frequency from equation One. This arrangement not only does away with a pre-settable counter, but also improves the resolution of the system.

In the converter shown in FIG. 5, the $F_{clk}$ input terminal goes to one input of a gate 27, whose output is applied to the clk terminal of a counter 28 whose $Q_B$ output is connected to the other input of gate 27, and the $E_n$ input of a counter 29 whose terminals $Q_0$ to $Q_3$ yield the least significant bit of N, terminal $Q_3$ going to the computer interrupt.

The trigger input terminal $T_r$ goes to the reset terminals of counters 28, 29 and 30 as well as one input of a gate 31, the output of gate 31 going to the RESET terminal of counter 26. The $F_{in}$ input terminal is connected to the ck terminal of counter 29 and to one input of gate 32 whose output is connected to the second input of gate 31. The other input of gate 31 goes to the $Q_A$ output of counter 28 and to one input of gate 33. The output gate 33 is applied to the $E_n$ input of counter 26, the other input of gate 33 being connected to the $\overline{Q}$ terminal of counter 30.

In the first embodiment of the converter shown in FIG. 3, the computer reads the quantity B+R from counter 23. If this counter has "t" stages, the maximum value of B+R is $(2^t-1)$. In the second embodiment shown in FIG. 5, values B and R are read separately and each can have a maximum value of $(2^t-1)$. The maximum value of B+R is then $2 \times (2^t-1)$, a two-fold improvement in resolution.

The second embodiment eliminates the need for both a B and R counter. It does, however, require some means for changing the single counter's counting mode after the measurement of B is completed so that it properly counts the quantity R. A typical mode changing scheme would be to switch modes in the middle of the measuring interval. The computer should then get B by reading the counter immediately prior to the interval's midpoint. The mode changing means would then detect the midpoint of the interval and change the inputs to the counter so as to allow it to measure R. Other means to effect mode changing are possible, depending on the actual details of the implementation.

While there have been shown and described preferred embodiments of a frequency-to-binary converter in accordance with the invention, it will be appreciated that many changes and modifications may be made therein without, however, departing from the essential spirit thereof.

I claim:

1. A converter for converting an input signal whose frequency varies as a function of a parameter being metered into a binary number for manipulation by a digital computer, said converter comprising:
    A means to shape the input signal to produce a continuous train of square wave periods, each beginning with a leading edge;
    B means to effect measurement during a time interval having a fixed duration which is a predetermined multiple of a given unit of time, said interval being independent of the frequency of the input signal and being unsynchronized therewith, whereby measurement takes place during that slice of the continuous train which falls between the start and finish points of the time interval;
    C means during the time interval to measure the following factors:
        (1) the number of time units occurring between the start point and the leading edge of the first complete wave period in the slice;
        (2) the number of complete wave periods lying within the slice; and
        (3) the number of time units occurring between the last leading edge appearing in the slice and the finish point; and
    D means to apply the measured factors to the digital computer which from the known relationship between frequency and these factors calculates the incoming frequency.

2. A converter as set forth in claim 1, wherein the time interval is equal to KT, where K is a positive integer and T is a predetermined unit of time.

3. A converter as set forth in claim 2, wherein said square wave periods each have a value P, each period having a positive leading edge, the period P being equal to $1/F_{in}$ where $F_{in}$ is the frequency of the input signal.

4. A converter as set forth in claim 3, wherein the number of time units T between the start point of the interval and the first leading edge in the slice is designated B, the number of complete wave periods P which occur during the interval is designated N and the number of time units T which occur between the last leading edge and the finish point is designated R, the equation for frequency being:

$$F_{in} = \frac{1}{T} \frac{N}{K - (B + R)}$$

5. The method of converting an input signal whose frequency $F_{in}$ is unknown into a binary value for manipulation by a digital computer, the method comprising the steps of:
    A shaping the input signal into a continuous train of square wave periods P, each beginning with a leading edge;
    B effecting measurements during a time interval having a fixed duration which is a predetermined integral multiple K of a time unit T, said interval being independent of the frequency of the input signal and being unsynchronized therewith, whereby measurement takes place during that slice of the continuous train which falls between the start and finish points of the intervals;
    C measuring during the time intervals KT (1) the number B of time units T occurring between the start point and the leading edge of the first complete wave period in the slice; (2) the number N of complete wave periods P lying within the slice; and (3) the number R of time units T occurring between the last leading edge appearing in the slice and the finish point; and
    D applying the values K, T, B, R and N to the digital computer to calculate the frequency $F_{in}$ from the following equation:

$$F_{in} = \frac{1}{T} \frac{N}{K - (B + R)}$$

* * * * *